(12) United States Patent
Mahamuni et al.

(10) Patent No.: US 8,205,040 B1
(45) Date of Patent: Jun. 19, 2012

(54) STORING CONTENT IN A TERNARY CONTENT ADDRESSABLE MEMORY

(75) Inventors: Atul Mahamuni, San Jose, CA (US); Sandip Shah, Milpitas, CA (US); Rudramahesh Rugge, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 1162 days.

(21) Appl. No.: 12/021,994

(22) Filed: Jan. 29, 2008

(51) Int. Cl.
*G06F 13/00* (2006.01)
*G06F 13/28* (2006.01)

(52) U.S. Cl. ........ 711/108; 370/389; 370/392; 370/401; 370/412; 726/13; 709/220; 709/221; 709/222; 709/225; 365/49.17

(58) Field of Classification Search ..................... 726/13
See application file for complete search history.

(56) References Cited

U.S. PATENT DOCUMENTS

| | | | |
|---|---|---|---|
| 6,516,383 B1 * | 2/2003 | Patra et al. | 711/108 |
| 6,532,516 B1 * | 3/2003 | Krishna et al. | 711/108 |
| 6,718,326 B2 * | 4/2004 | Uga et al. | 1/1 |
| 7,028,098 B2 * | 4/2006 | Mate et al. | 709/238 |

* cited by examiner

*Primary Examiner* — Nathan Flynn
*Assistant Examiner* — Bryan Wright
(74) *Attorney, Agent, or Firm* — Harrity & Harrity, LLP (57) ABSTRACT

A device may select a longest run of contiguous unwritten pages from multiple runs of contiguous unwritten pages provided in a ternary content addressable memory, and may write a rule on a page that is located at a middle portion of the longest run to create two runs of contiguous unwritten pages. The device may also receive a packet, and may apply the rule to the packet.

19 Claims, 11 Drawing Sheets

STORING CONTENT IN A TERNARY CONTENT ADDRESSABLE MEMORY

BACKGROUND

A content addressable memory (CAM) permits a lookup of content provided in the CAM based on a key. Because the lookup may be performed in a single or few operations, the lookup performed on the CAM may be performed much faster than a lookup performed on a random access memory (RAM).

SUMMARY

According to one aspect, a method may include selecting a longest run of contiguous unwritten pages from a plurality of runs of contiguous unwritten pages provided in a ternary content addressable memory, writing a rule on a page that is located at a middle portion of the longest run to create two runs of contiguous unwritten pages, receiving a packet, and applying the rule to the packet.

BRIEF DESCRIPTION OF THE DRAWINGS

The accompanying drawings, which are incorporated in and constitute a part of this specification, illustrate one or more embodiments described herein and, together with the description, explain the embodiments. In the drawings.

DETAILED DESCRIPTION

The following detailed description refers to the accompanying drawings. The same reference numbers in different drawings may identify the same or similar elements. The term "run," as used herein, may refer to contiguous or consecutive empty or unused blocks, segments, or pages of memory.

As described below, a device may store information in a memory segment (also referred to as a "segment") that is allocated from a ternary content addressable memory (TCAM). In a TCAM, an empty segment may be selected and used to store information such that remaining empty segments (e.g., segments with content) may be substantially evenly interspersed between the used segments in the TCAM.

Exemplary Ternary Content Addressable Memory

Figure 1A:
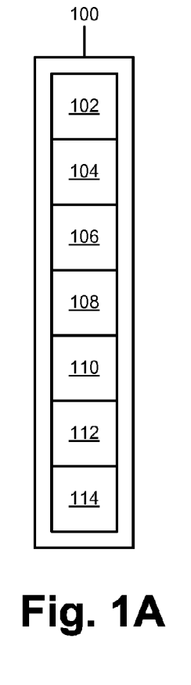
FIGS. 1A-1E are block diagrams of portions of an exemplary ternary content addressable memory (TCAM)

FIG. 1A shows a portion of an exemplary TCAM 100. As illustrated, TCAM 100 may include seven contiguous empty memory segments 102-114. Memory segments 102-114 may store different types of information, such as rules for packet classification, firewall rules (access control list (ACL) rules, etc.).

In some implementations, information in TCAM 100 may need to be stored in a specific order. For instance, rules for a specific firewall in TCAM 100 may need to be stored in the order the rules are defined. A reason is that when TCAM 100 is used to retrieve a rule based on criteria, TCAM 100 may return a first matching rule in a set of rules for the firewall.

In the above, when the information is stored (e.g., when a first rule for a firewall is provided or defined), a segment may be allocated from TCAM 100 to store the information, such that unallocated segments are evenly distributed over TCAM 100. If additional information has to be stored in a specific order relative to already stored information (e.g., firewall rules for the same firewall), and there is no more memory that preserves the order is available in TCAM 100, information on the allocated segments may need to be rewritten or reshuffled to different segments in TCAM 100. The rewriting may be time consuming and computationally expensive. To avoid such situations, whenever information that does not require a specific order in TCAM 100 (e.g., a first rule of a firewall) is stored, a segment for storing the information may be selected so that unallocated segments are evenly distributed over TCAM 100.

Figure 1B:
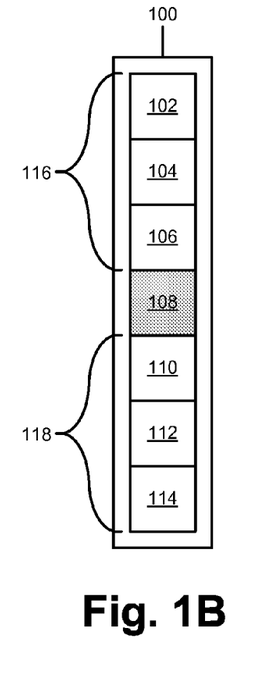
Figure 1C:
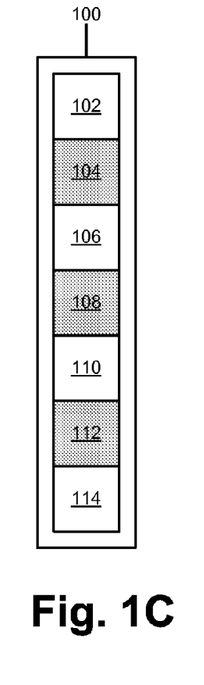

To illustrate the concept, assume that segment 108 is selected and information (e.g., a rule for a firewall) is stored therein. FIG. 1B shows a result of selecting segment 108 in TCAM 100 and storing the information in segment 108. As illustrated, TCAM 100 may include two runs of contiguous empty segments 116 and 118 that may be evenly distributed about selected segment 108. If additional empty segments are needed (e.g., for rules that belong to different firewalls), additional empty segments (e.g., empty segments 104 and 112) may be selected and used to store information. FIG. 1C shows a result of selecting and storing information in segments 104 and 112. As shown, empty segments 102, 106, 110, and 114 may be substantially evenly spread over TCAM 100.

Figure 1D:
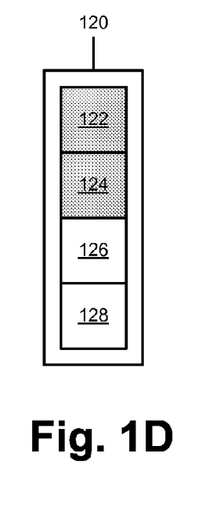

Without evenly distributed empty segments, as a TCAM becomes filled with more data, when new information that requires contiguous memory allocation is inserted in the TCAM, content of the TCAM may need to be rewritten over different segments of the TCAM. For example, FIG. 1D shows a portion of a TCAM 120 with unevenly distributed empty segments. As illustrated, TCAM 120 may include used segments 122 (e.g., for a first firewall) and 124 (e.g., for a second firewall) and empty segments 126 and 128. If a piece of data (e.g., a rule that belongs to the first firewall) is inserted into segment 122 and causes an overflow within segment 122, the overflow may be written into segment 124. However, because segment 124 is already being used, to accommodate the overflow, the data in segment 124 may need to be reshuffled to empty segment 126.

Figure 1E:
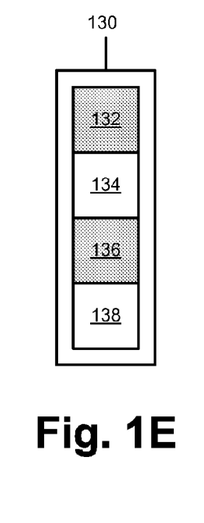

In contrast, FIG. 1E shows a portion of a TCAM 130 with evenly distributed empty/used segments. As illustrated, TCAM 130 may include used segments 132 and 136 and empty segments 134 and 138. If a piece of data is inserted into segment 132 and causes an overflow within segment 132, the overflow may be written into an empty segment 134. No further revision of TCAM 130 may be needed to accommodate the overflow.

Exemplary Network Configuration

Figure 2:
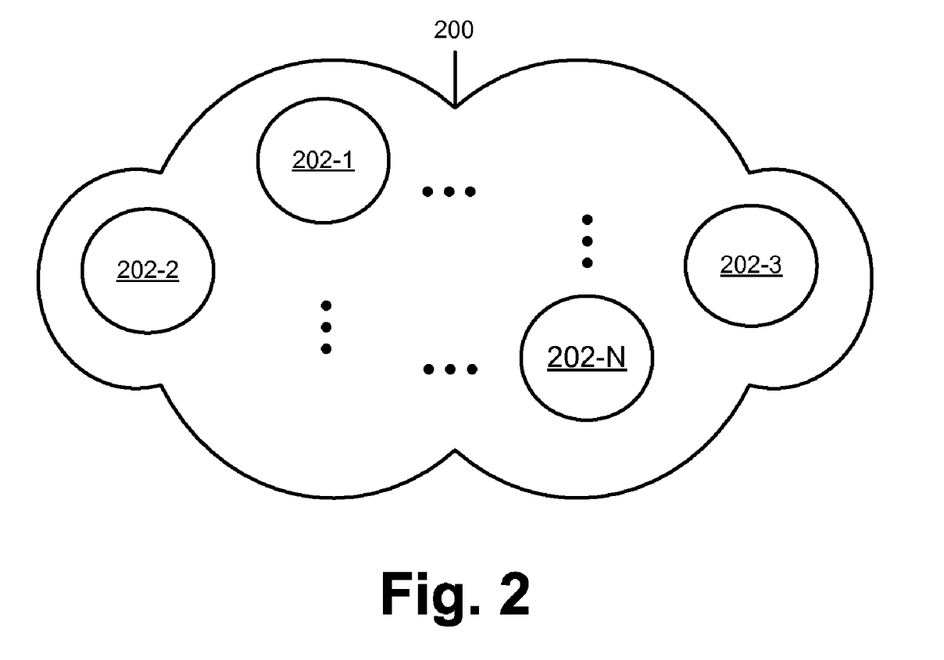
FIG. 2 is a diagram of an exemplary network in which concepts described herein may be implemented.

FIG. 2 illustrates an exemplary network 200 in which concepts described herein may be implemented. As shown, network 200 may include a number (N) of interconnected network devices 202-1 through 202-N (collectively referred to herein as "network devices 202" and individually as "network device 202-x"). Network devices 202 may be interconnected via wireless and/or wired connections. Network 200 may include the Internet, an ad hoc network, a local area network (LAN), a wide area network (WAN), a metropolitan area network (MAN), a cellular network, a public switched telephone network (PSTN), any other network, or a combination of one or more networks. Each of network devices 202 may include a switch, a router, a server, a proxy server, a firewall, a router, and/or another type of device. While network devices 202 may be implemented as different types of devices, in the following paragraphs, network devices 202 will be described herein in terms of a router or a switch.

Exemplary Network Device Configuration

Figure 3:
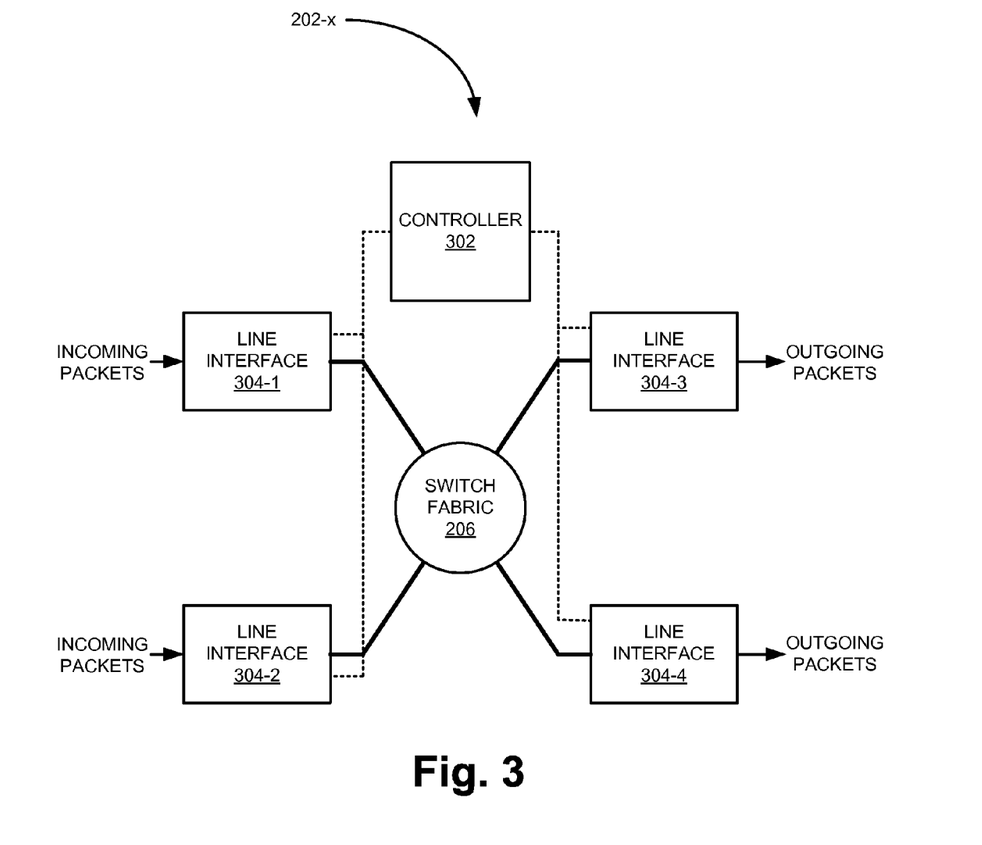
FIG. 3 is a diagram of an exemplary network device of the network depicted in FIG. 2.

FIG. 3 illustrates an exemplary network device 202-x. As shown, network device 202-x may include a controller 302, line interfaces 304-1 through 304-4 (collectively referred to herein as "line interfaces 304" and individually as "line interface 304-x"), and a switch fabric 306. Controller 302 may include components for managing routes and/or types of information that may require centralized processing. For example, controller 302 may manage routes (e.g., may accept or disseminate routes to other network devices 202) in accordance with routing/signaling protocols, may receive and process statistics related to a flow of packets, and/or may process packet samples from other components of network device 202-x (e.g., from line interfaces 304). In another example, controller 302 may provide functionalities related to distributing content (e.g., via rules for classifying packets) to other components of device 202-x.

Each of line interfaces 304 may include components for receiving packets from devices or components in network 200 and for transmitting the packets to other devices in network 200. In addition, each of line interfaces 304 may perform packet forwarding, packet classification, internal redirection of packets to other components in network device 202-x, management of a table that retains statistics about packets, and sampling of packets. Switch fabric 306 may include one or more switches for conveying packets from line interfaces 304 and/or other modules (not shown) to line interfaces 304 and/or to the other modules.

Network device 202-x may include fewer, additional, and/or different components than shown in FIG. 3. For example, network device 202-x may include additional or fewer line interfaces or additional controllers. Network device 202-x may include one or more service modules (not shown) that are connected to switch fabric 306 and perform various network services. For example, network device 202-x may include a firewall service module, an intrusion detection service module, an encryption/decryption service module, or other types of service modules.

Figure 4:
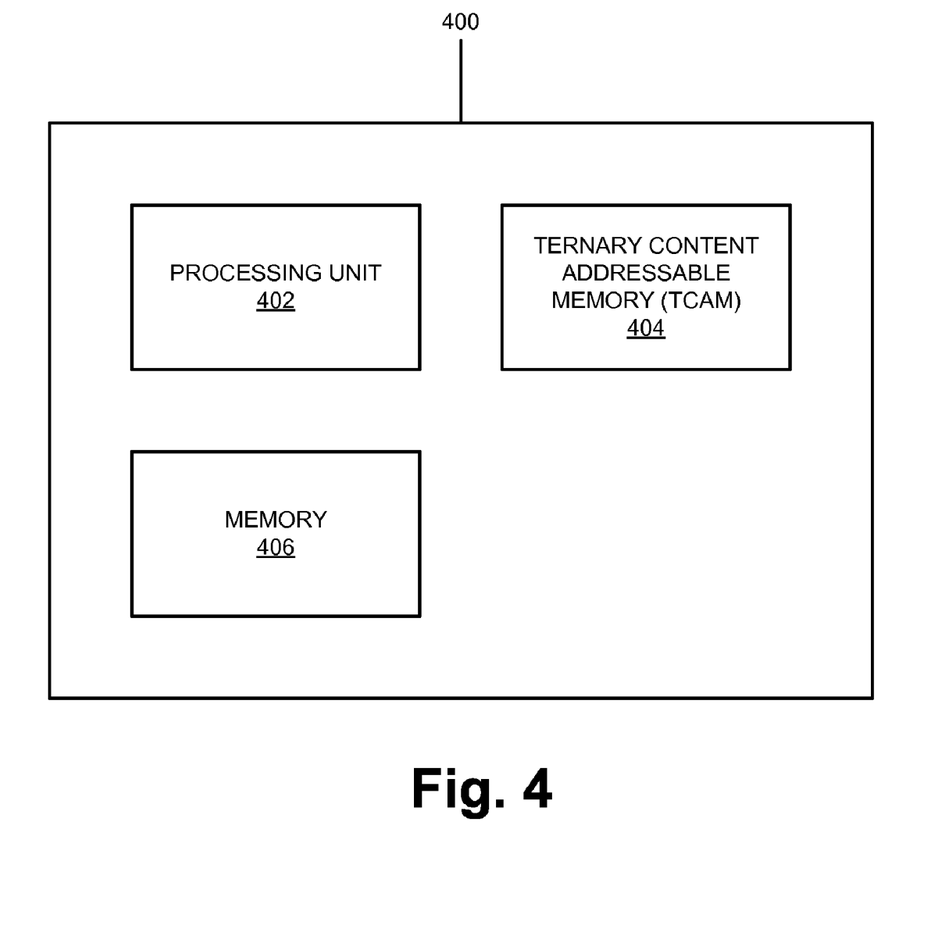
FIG. 4 is a block diagram of an exemplary component of the network device depicted in FIG. 3.

FIG. 4 is a block diagram of a component 400 of network device 202-x. Component 400 may correspond to controller 302, line interface 304-x, or another component that may be included in network device 202-x. As shown, component 400 may include a processing unit 402, a TCAM 404, and/or other types of memory 406. In other implementations, component 400 may include additional, fewer, or different components than the components illustrated in FIG. 4.

Processing unit 402 may include a processor, a microprocessor, an Application Specific Integrated Circuit (ASIC), a Field Programmable Gate Array (FPGA), and/or other processing logic capable of controlling component 400 and/or network device 202-x.

TCAM 404 may include a memory that can retrieve, given a key, content associated with the key in a fixed span of time. In one implementation, TCAM 404 may be included in component 400 based upon its speed in retrieving content based on a key.

Memory 406 may include static memory, such as read only memory (ROM), and/or dynamic memory, such as random access memory (RAM), static RAM (SRAM), or onboard cache, for storing data and machine-readable instructions. Memory 406 may also include storage devices, such as a floppy disk, Compact Disk (CD) ROM, CD read/write (R/W) disc, and/or flash memory, as well as other types of storage devices.

Figure 5:
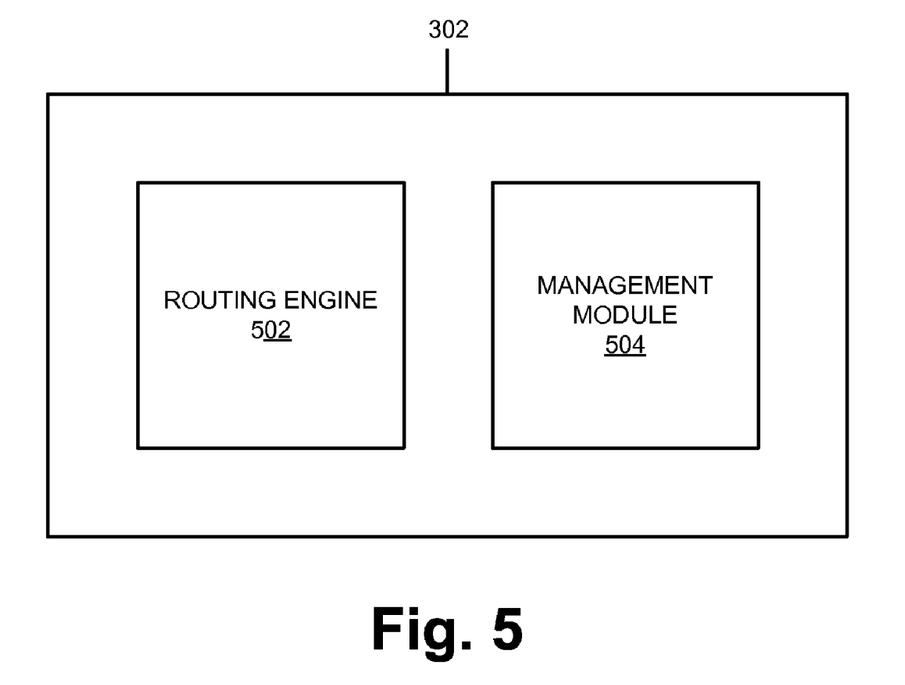
FIG. 5 is a functional block diagram of an exemplary controller of the network device depicted in FIG. 3.

FIG. 5 is a functional block diagram of controller 302. As shown, controller 302 may include a routing engine 502 and a management module 504. In other implementations, controller 302 may include additional, fewer, and/or different functional components than those components illustrated in FIG. 5. For example, controller 302 may include an engine for processing and/or sending information about packet statistics to other components of network device 202-x.

Routing engine 502 may include hardware and/or software for communicating with other routers/switches to gather and store routing/switching information. Management module 504 may receive rules and/or content from other devices and/or users. In addition, management module 504 may distribute/retrieve the rules (e.g., access control list (ACL) rules) and/or content to/from TCAM 404 and/or memory 406 on line interface 304-x, and/or provide a central point of control for managing TCAM 404 and/or other components (e.g., memory 406) network device 202-x.

Figure 6:
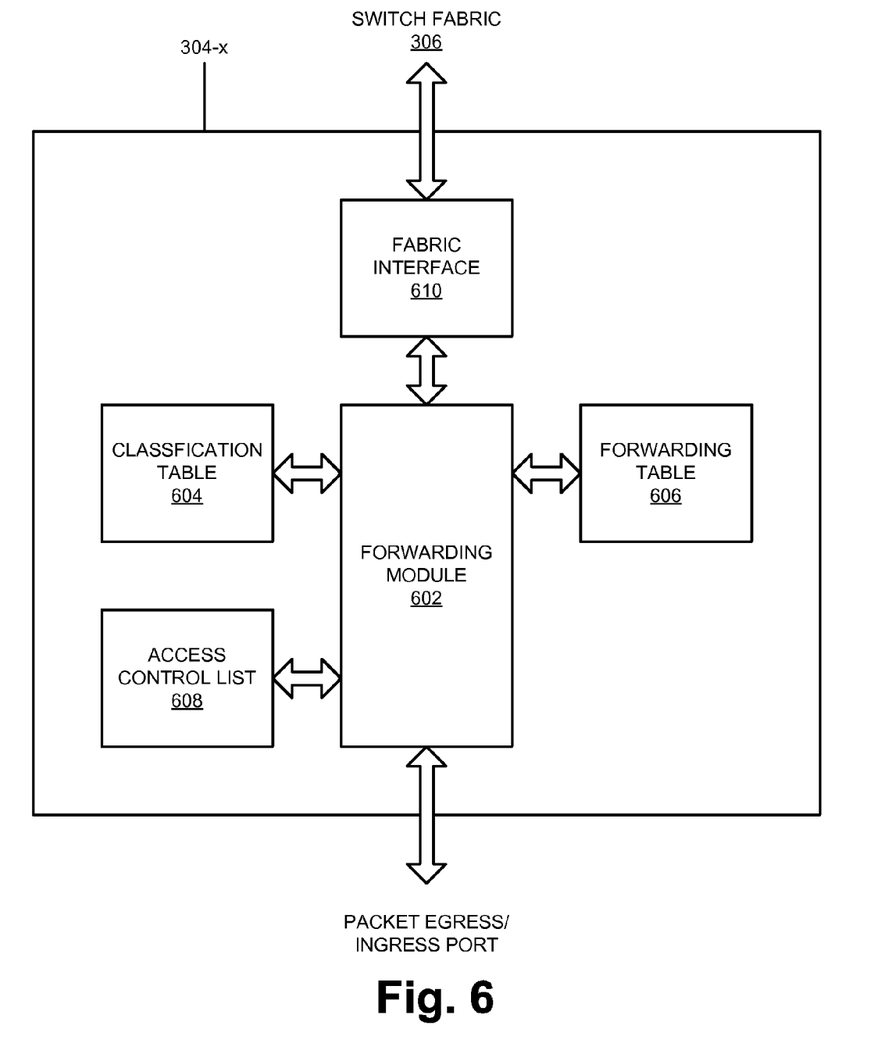
FIG. 6 is a functional block diagram of an exemplary line interface of the network device depicted in FIG. 3.

FIG. 6 is a functional block diagram of an exemplary line interface 304-x. As shown, line interface 304-x may include a forwarding module 602, a classification table 604, a forwarding table 606, an access control list (ACL) 608, and a fabric interface 610. In other implementations, line interface 304-x may include fewer, additional, or different functional components than those functional components illustrated in FIG. 6.

Forwarding module 602 may include hardware and/or software for forwarding and/or classifying a packet that is received at line interface 304-x (e.g., at an egress/ingress port). Forwarding module 602 may perform a lookup in classification table 604 and/or forwarding table 606, and may obtain a packet descriptor that includes a forwarding address (e.g., a destination switch fabric port, a destination network port, etc.). In addition, forwarding module 602 may augment the packet by appending the packet descriptor to the packet, and forward the original packet or the augmented packet to one of line interfaces 304.

Classification table 604 may include classification rules for categorizing a packet based on a packet header. Examples of classification rules may include rules for performing an ACL lookup (e.g., a rule that specifies that if a field in a packet header is one of specified values, then perform a lookup in ACL 608), for performing a policy based routing (e.g., a rule that specifies that if a packet header is a telephony packet, then route the packet from X to Y via an asynchronous transfer mode (ATM) circuit), and for rendering differentiated quality of service (QoS).

Forwarding table 606 may include information for identifying an egress line interface to forward an incoming packet to a network device based on the packet's network destination address. ACL 608 may include a list of rules that are related to packets, services, and/or service ports that are available on network device 202-x.

Fabric interface 610 may include hardware and/or software for providing an interface to switch fabric 306, sampling packets, and managing the sampled packets and/or packet statistics. Fabric interface 610 may include one or more interfacing buffers (not shown) for temporarily storing augmented packets (e.g., packets pre-pended with additional header information) from forwarding module 602. The buffers may prevent the packets from being dropped if a bottleneck (e.g., a processing delay) develops on a line interface-to-line interface path during packet transport.

Figure 7:
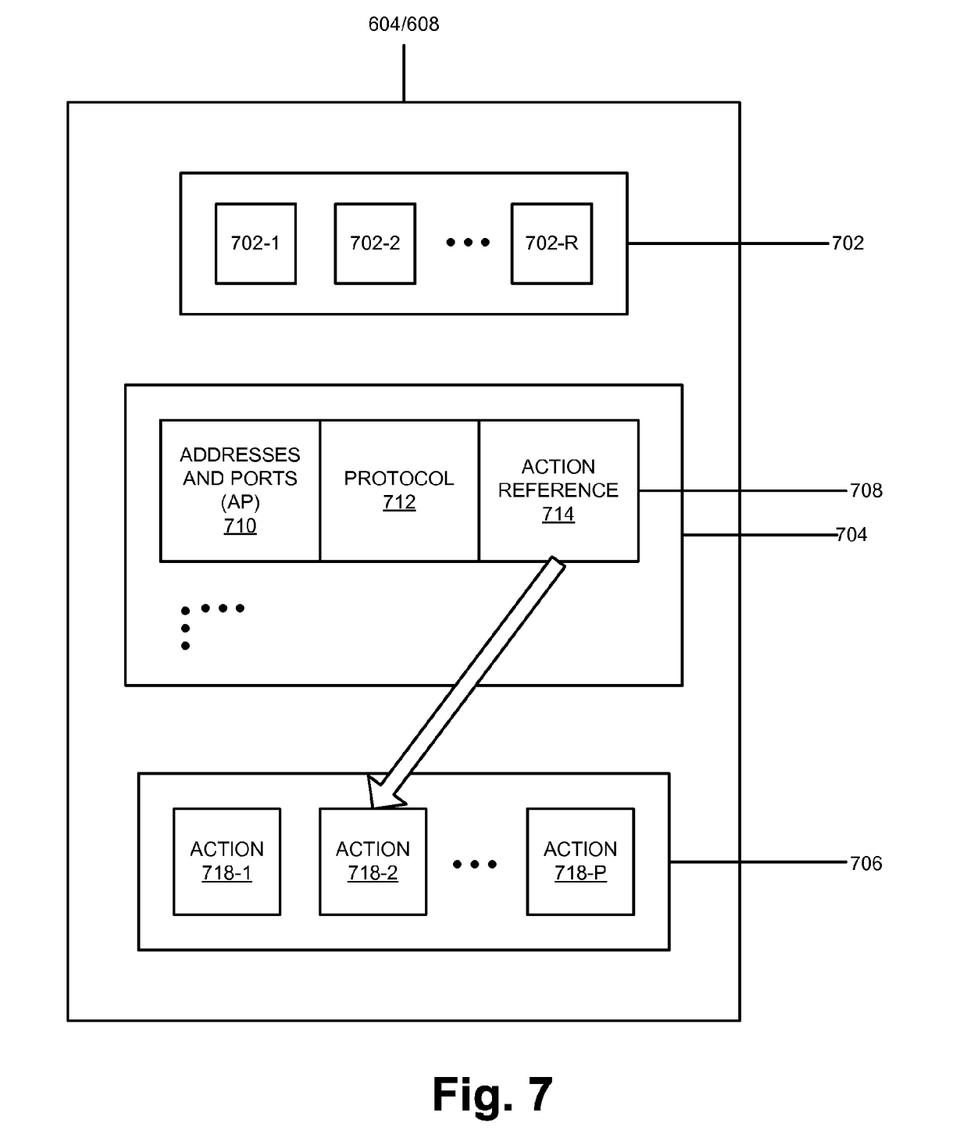
FIG. 7 is a functional block diagram of an exemplary classification table and/or an access control list (ACL) of the line interface card depicted in FIG. 6.

FIG. 7 is a functional block diagram of an exemplary classification table 604 and/or ACL 608. As shown, classification table 604/ACL 608 may include a run table 702, a TCAM table 704, and an action table 708. In other implementations, classification table 604/ACL 608 may include additional, fewer, or different functional components than the functional components illustrated in FIG. 7.

Run table 702 may be included in memory 406 (e.g., SRAM) and may include components for creating, removing, and/or updating content in TCAM table 704. As further shown in FIG. 7, run table 702 may include run records 702-1 through 702-R (collectively referred to herein as "run records 702" and individually as "702-x"). Each of run records 702 may include information associated with units of memory (also referred to as "pages" or "segments") in TCAM table 704. In other implementations, run table 702 may be constructed as a linked list, a table, a tree, an array, etc.

TCAM table 704 may be provided in TCAM 404 and may include one or more entries (e.g., rules) that are aggregated and/or arranged in pages or segments (not shown in FIG. 7). As shown in FIG. 7, each entry 708 may include one or more fields, such as addresses and ports fields 710, a protocol field 712, an action reference field 714, etc. In other implementations, entry 708 may include additional, fewer, or different fields than the fields illustrated in FIG. 7.

Addresses and ports fields 710 may include addresses and/or port numbers. Protocol field 712 may include a number that corresponds to a protocol. Action reference field 714 may include a reference (e.g., an address) to a memory location (e.g., a location in an SRAM) that stores additional information related to entry 708. In one implementation, action reference field 714 may include information about the entry, rather than a reference to a location in memory.

In an exemplary implementation, if TCAM 404 is presented with a portion of a packet header, the portion may be compared to different fields (e.g., addresses and ports fields 710, protocol field 712, etc.) of the entries in TCAM table 704. If the fields of entry 708 match the portion of the packet header, TCAM 404 may return the value of action reference field 714. The value of action reference field 714 may be used to obtain specific information and/or an action that relates to the packet.

Action table 706 may be provided in memory 406 and may include one or more actions or information for different entries of TCAM table 704. In one implementation, content of action table 706 may be included in TCAM 404 or distributed over action reference fields 714 of the entries in TCAM table 704.

Figure 8:
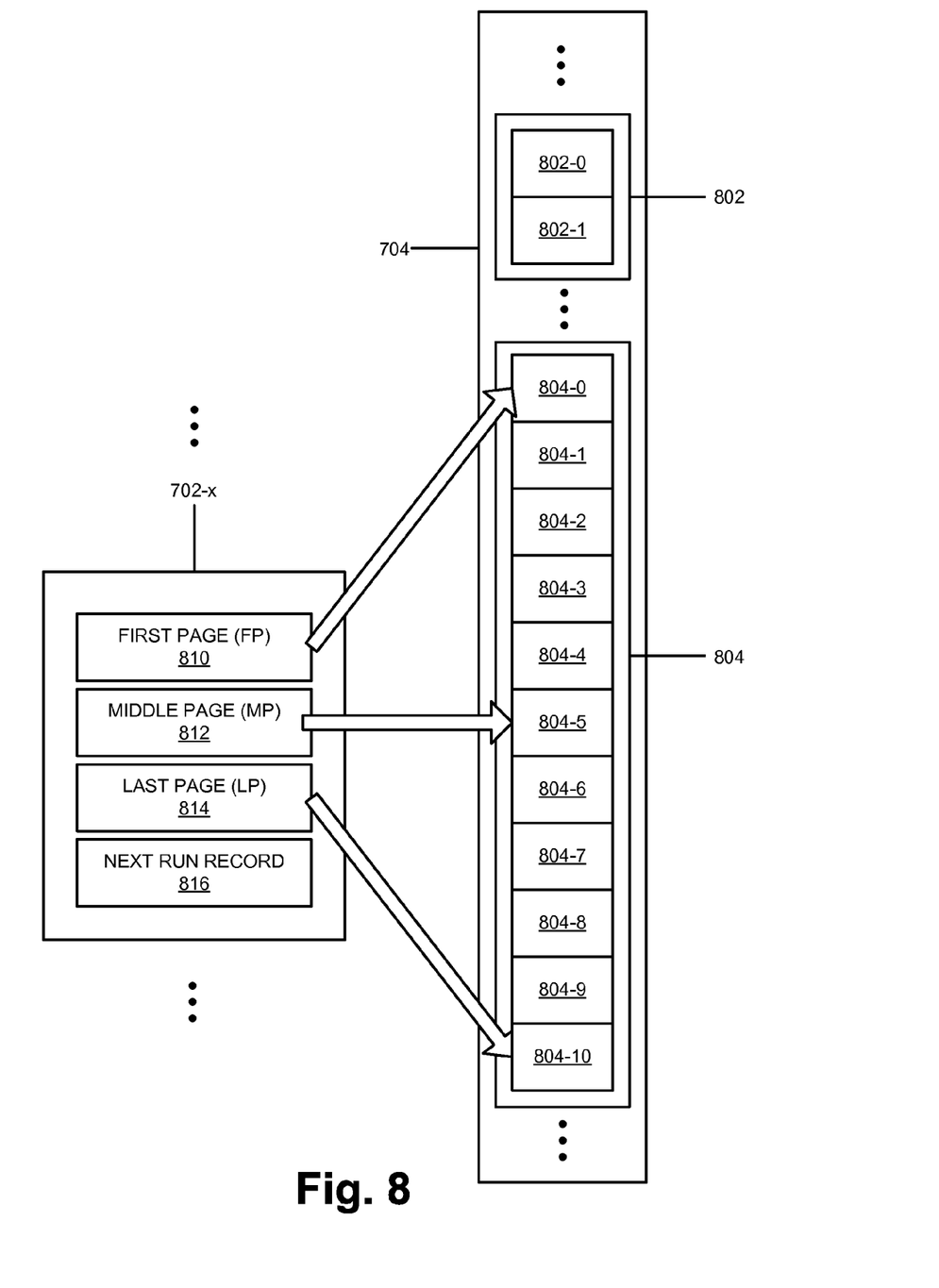
FIG. 8 is a functional block diagram of an exemplary run record and an exemplary TCAM table of the classification table/ACL depicted in FIG. 7.

FIG. 8 is a functional block diagram of exemplary run record 702-x and TCAM table 704. As shown, TCAM table 704 may include a first run of contiguous empty pages 802, a second run of contiguous empty pages 804, etc., and used pages (not shown). As further shown, first run 802 may include contiguous empty pages 802-0 and 802-1, and second run 804 may include contiguous empty pages 804-0 through 804-10. The used pages, which are not shown, may include entries 708 (FIG. 7).

Run record 702-x may be associated with a run of contiguous empty pages, and may include a first page (FP) field 810, a middle page field (MP) field 812, a last page field 814, and a next run record field 816. In FIG. 8, run record 702-x is shown as being associated with second run 804, but may be associated with runs other than second run 804.

FP field 810 may include a reference (e.g., an address) of a first page (e.g., page 804-0) of second run 804 that is associated with run record 702-x. MP field 812 may include a reference to a middle page (e.g., page 804-5) of second run 804. LP field 814 may include a reference to a last page (e.g., page 804-10) of second run 804, and next record field 816 may include a reference to another run record (not shown).

If run table 702 is constructed as a linked list, each of run records 702-1 through 702-R may be attached to another record 702-x via next record field 816. In one implementation, the run records 702-1 through 702-R in the list may be linked in an specific order. The order may depend on, for each run record, the length of a run that is associated with the each run record. For example, run records 702-1 through 702-R may ordered in accordance with decreasing lengths of the runs.

Exemplary Process for Storing Content in a Ternary Content Addressable Memory

Figure 9:
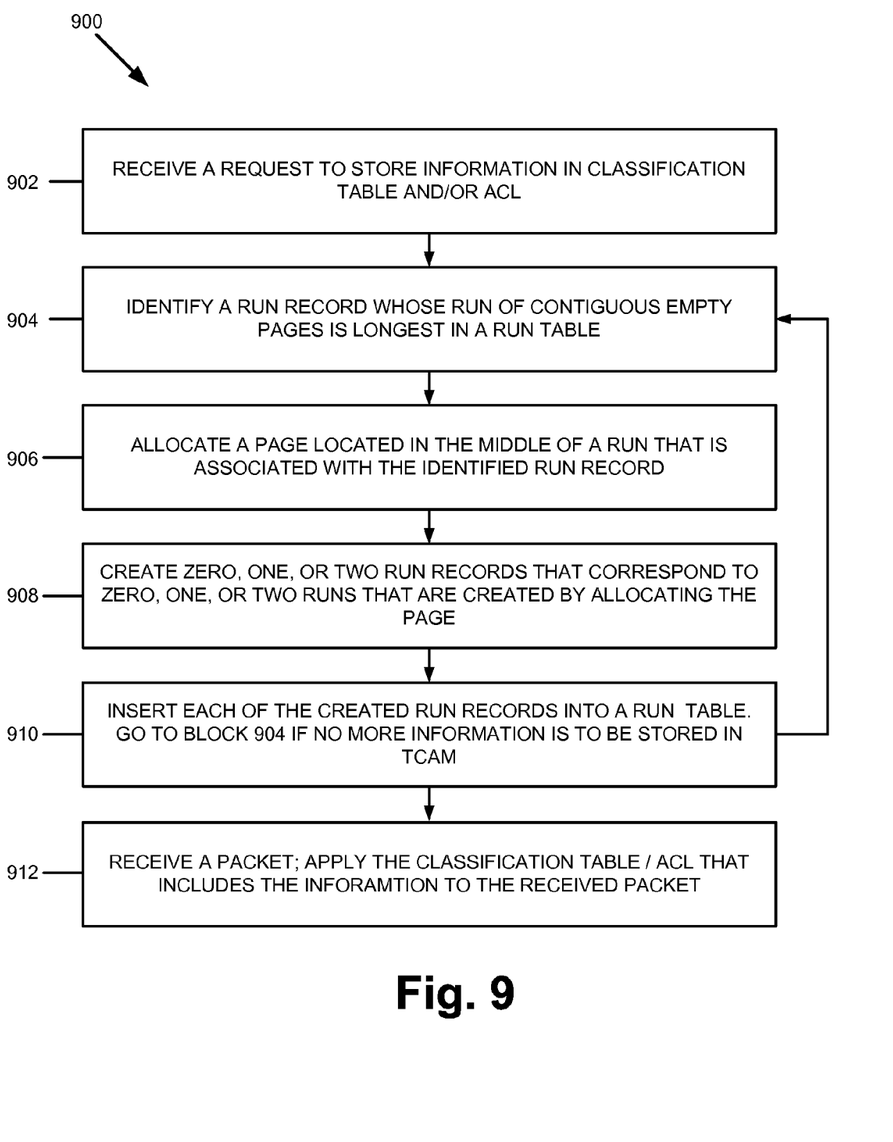
FIG. 9 is a flow chart of an exemplary process for storing content in the TCAM table of FIG. 8.

FIG. 9 is a flow chart of an exemplary process 900 for storing content in TCAM 404. In the following discussion, a length of a run that is associated with a run record may be referred to as the length of the run record. Depending on the implementation, process 900 may be performed by component 300 or management module 504 within controller 202.

As shown, process 900 may begin with receipt, by component 300, of a request to store information in classification table 604 and/or ACL 608 (block 902). In one implementation, the request may be received from a use or another device via management module 504 in controller 302. In another implementation, the request may be received from another component within network device 202-x (e.g., a line card 304-x, a service module, etc.).

A run record whose run of contiguous empty pages is longest in run table 702 may be identified (block 904). In one implementation, run table 702 may include run records that are arranged in the order of decreasing lengths of the run records. In such an implementation, the first run record in run table 702 may have the longest length.

A page located in the middle of a run that is associated with the identified run record 702-x may be allocated (block 906). Allocating the page may entail removing the identified run record that is associated with the run from run table 704, as allocating the page may destroy the run. In addition, the information that is requested to be stored (block 902) may be written on the allocated page and/or memory 406. If the format of the stored information includes action reference field 714, action reference field 714 may include the address of a memory at which some of the information is stored.

Zero, one, or two run records that correspond to zero, one, or two runs that are created by allocating the page may be created (block 908). If the length of the identified run record is greater than or equal to three, allocating the page may create two runs and destroy the run associated with the identified run record. In such an instance, two run records that correspond to the two new runs may be created.

Figure 10:
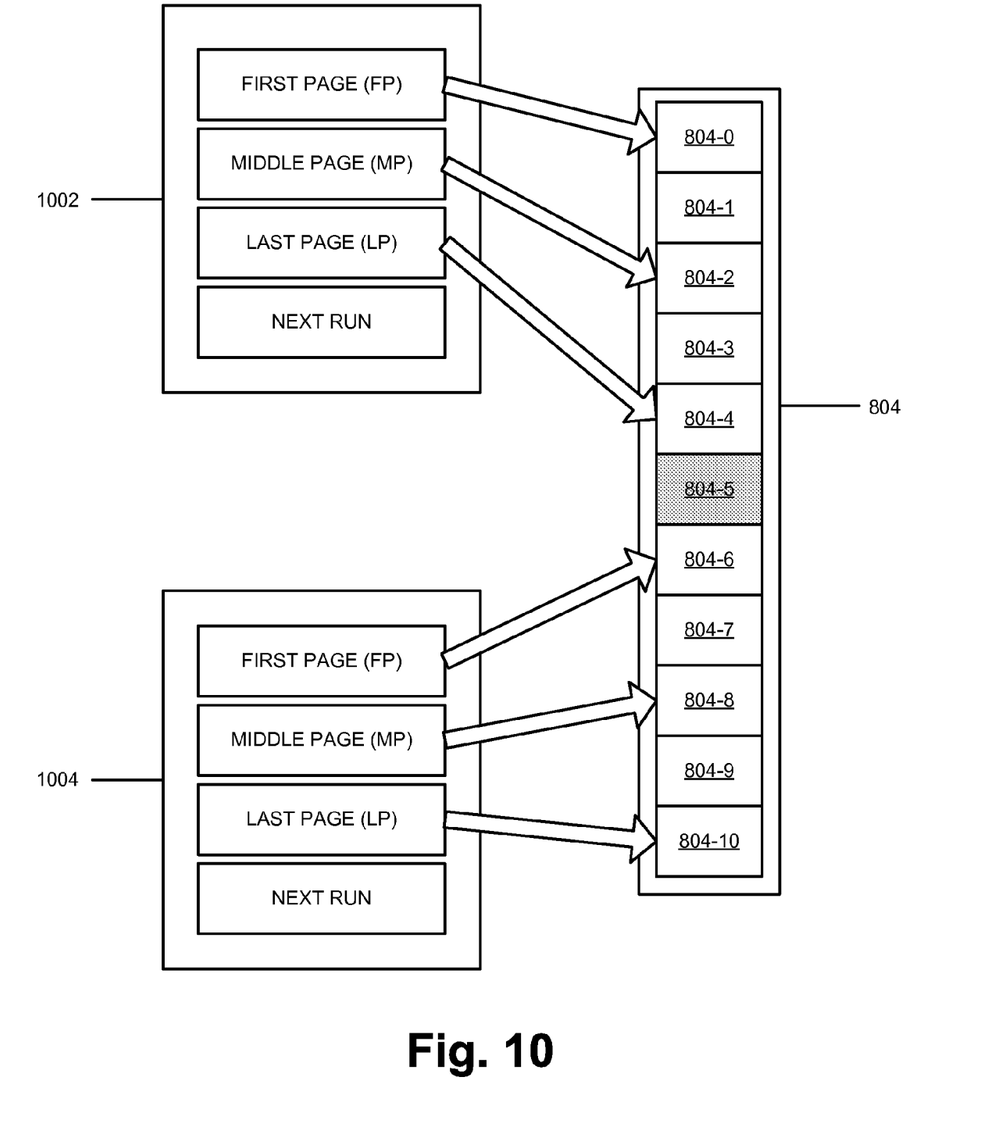
FIG. 10 is a functional block diagram of run records and runs of contiguous empty pages as a result of selecting a page in an exemplary run of contiguous empty pages of FIG. 8.

For example, FIG. 10 is a functional block diagram of run records and runs of contiguous empty pages that are created if a page in second run 804 of contiguous empty pages is allocated. As shown, allocating page 804-5 of second run 804 may create a run of pages 804-0 through 804-4 and a run of pages 804-6 through 804-10. To keep track of runs 804-0 through 804-4 and 804-6 through 804-10, component 300 may create a run record 1002 for the run of pages 804-0 to 804-4 and a run record 1004 for the run of pages 804-6 to 804-10. FP field 810, MP field 812, and LP field 814 of run record 1002 may be set to reference pages 804-0, 804-2, and 804-4, respectively; and FP field 810, MP field 812, and LP field 814 of run record 1004 may be set to reference pages 804-6, 804-8, and 804-10, respectively.

Returning to FIG. 9 (block 908), if the length of the identified run record is equal to two, allocating a page of the run associated with the run record may leave only one empty page within the run. In such an instance, only one new run record that corresponds to the empty page may be created.

If the length of the identified run record is equal to one, allocating a page of the run associated with the identified run record may leave no empty page, and therefore, no run record may be created.

Each of the created run records may be inserted in run table 702 (block 910). By inserting each of the created run records into run table 702, component 300 may maintain the order in which the run records in run table 702 are arranged. For example, a created run record may be inserted between run records whose lengths are longer and shorter than that of the created record. In a more specific example, assume that the length of a created run record A is ten, and the lengths of run records C and D in run table 702 are eleven and nine, respectively. Run record A may be inserted between run records C and D, so that run table 702 includes run records C, A, and D, in the order of decreasing lengths.

Process 900 may return to block 904 if there is additional information (e.g., rules) that may to be inserted in classification table 604/ACL 608 (block 910).

Component 300 may receive a packet, and may apply rules/information contained in a classification table 604/ACL 608 to the packet (block 912). Upon receiving the packet, component 300 may apply rules/information in classification table 604/ACL 608 to the packet. For example, suppose the information in classification table 604/ACL 608 includes a classification rule that requires component 300 to drop packets with Internet Protocol (IP) address 192.131.2.x. Component 300 may apply the classification rule to the packet along with other rules in classification table 604/ACL 608.

EXAMPLE

Figure 11A:
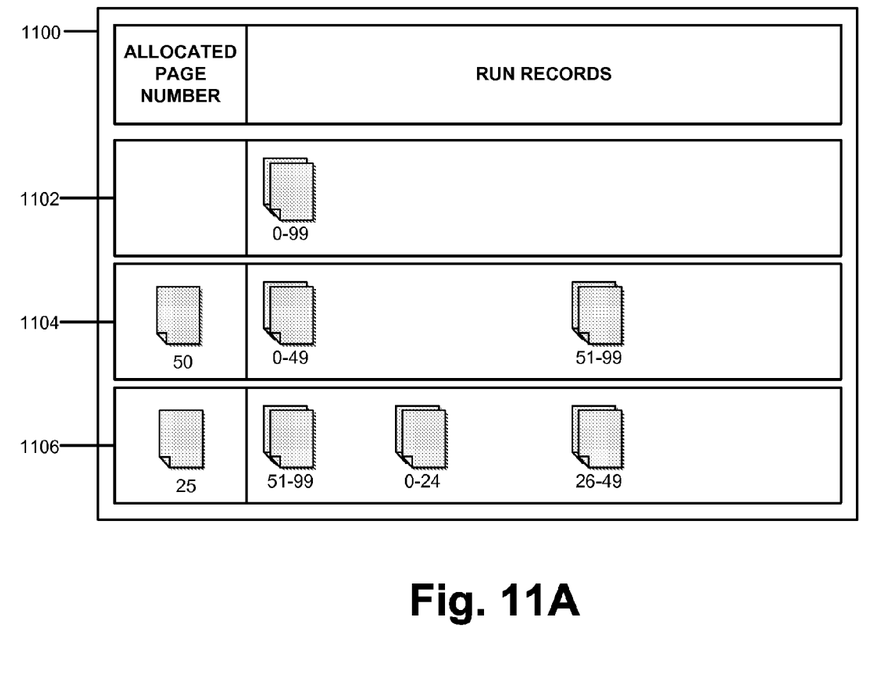
FIG. 11A shows exemplary content of the classification table of FIG. 7 when different pages are allocated from a TCAM table for a firewall.
Figure 11B:
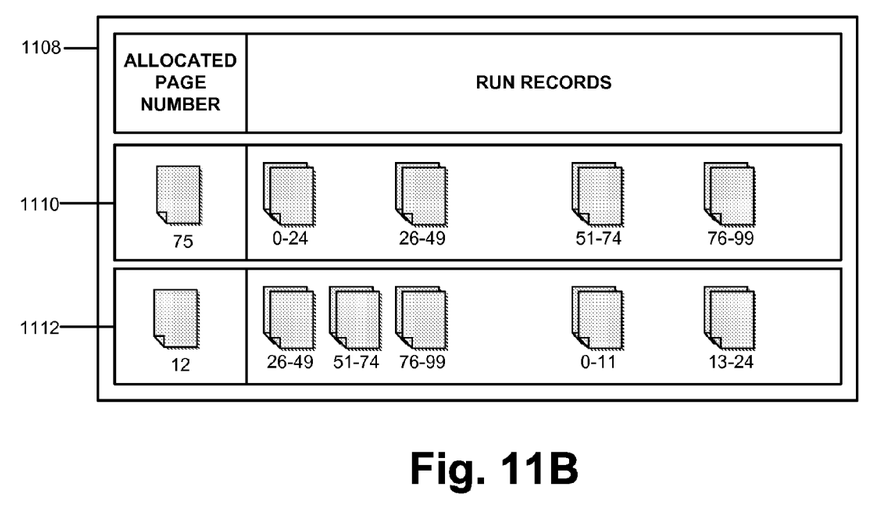
FIG. 11B shows exemplary content of the classification table of FIG. 7 when additional pages are allocated from the TCAM table for another firewall.

FIGS. 11A and 11B illustrate an example for storing content in a ternary content addressable memory. In one implementation, the example is consistent with exemplary process 900 described above with reference to FIG. 9.

Assume that management module 504 receives requests to store one set of rules for a first firewall and another set of rules for a second firewall, and that there are a total of one-hundred contiguous empty pages in TCAM table 704, indexed from "0-99." In addition, assume that each run record 702-x in run table 702 corresponds to a run of contiguous pages in TCAM table 704. In this example, each run record will be referenced by starting and ending indices of pages of a run. For instance, a run record 11-23 may be associated with a run of pages from page 11 to page 23.

In the example, to store a set of rules for the first firewall, a series of pages are allocated from TCAM table 704. As pages are allocated from TCAM table 704, run records are created in run table 702 to keep track of runs that are created.

FIG. 11A shows content (e.g., a table 1100) of run table 702 if different pages are allocated for the first firewall. As illustrated, table 1100 may include rows 1102, 1104, and 1106. Each row in table 1100 may show a page that is allocated from a TCAM table and resulting run records in run table 702. Before any pages are allocated, as shown by row 1102 of table 1100, run table 702 may include a single run record 0-99.

Row 1104 may show a result of allocating a first page 50 to store a rule. After a request to store a rule is received by component 300 and/or management module 504, component 300/management module 504 may identify run record 0-99 as representing a longest run in the TCAM table, since there are no additional runs. Furthermore, based on run record 0-99, component 300/management module 504 may allocate the page referenced by middle page field 812 of the run record 0-99. If page 50 is allocated from the middle of run 0-99, run 0-99 may be destroyed and new runs 0-49 and 51-99 may be created. Component 300/management module 504 may create run records 0-49 and 51-99 to reflect runs 0-49 and 51-99. Run records 0-49 and 51-99 may be arranged in the order of decreasing their lengths.

Row 1106 may show a result of allocating page 25. To allocate page 25, component 300/management module 504 may perform a process similar to the one described above for row 1104, resulting in the destruction of run record 0-49 and creation of run records 0-24 and 26-49.

FIG. 11B shows content (e.g., a table 1108) of run table 702 if additional pages are allocated from the TCAM table for the second firewall. As illustrated, table 1108 may include rows 1110 and 1112. Row 1110 may show a result of allocating page 75 to store a first rule for the second firewall. Run record 51-99 may be removed from run table 702 and run records 51-74 and 76-99 may be inserted in run table 702. Row 1112 may show a result of allocating page 12. Run record 0-24 may be removed from run table 702 and run records 9-11 and 13-24 may be inserted in run table 702.

In the above example, allocated pages 50 and 25 (i.e., pages for the first firewall) and pages 75 and 12 (i.e., pages for the second firewall) may be interleaved with empty pages between one another. This may permit additional pages to be allocated without extensive rearrangement of content by TCAM table 704. With evenly distributed used/empty segments, as a TCAM becomes filled with rules or data, content of the TCAM to may not need to be extensively rewritten over different pages of the TCAM.

CONCLUSION

The foregoing description of implementations provides illustration, but is not intended to be exhaustive or to limit the implementations to the precise form disclosed. Modifications and variations are possible in light of the above teachings or may be acquired from practice of the teachings.

For example, while series of blocks have been described with regard to an exemplary process illustrated in FIG. 9, the order of the blocks may be modified in other implementations. In addition, non-dependent blocks may represent acts that can be performed in parallel to other blocks.

It will be apparent that aspects described herein may be implemented in many different forms of software, firmware, and hardware in the implementations illustrated in the figures. The actual software code or specialized control hardware used to implement aspects does not limit the invention. Thus, the operation and behavior of the aspects were described without reference to the specific software code—it being understood that software and control hardware can be designed to implement the aspects based on the description herein.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the implementations described herein unless explicitly described as such. Also, as used herein, the article "a" is intended to include one or more items. Where one item is intended, the term "one" or similar language is used. Further, the phrase "based on" is intended to mean "based, at least in part, on" unless explicitly stated otherwise.

What is claimed is:

1. A method comprising:
    selecting, by a processor, a longest run of contiguous unwritten pages from a plurality of runs of contiguous unwritten pages provided in a ternary content addressable memory;
    writing, by the processor, a rule on a page that is located at a middle portion of the longest run to create, from the longest run of contiguous unwritten pages, two runs of contiguous unwritten pages, writing the rule including:
        creating two run records to track, respectively, the two runs of contiguous unwritten pages,
        allocating, in a memory, two memory blocks for, respectively, the two run records, the memory differing from the ternary content addressable memory,
        writing, in a first field, a first reference to a first page, of the longest run, the first field being included in one of the two memory blocks, and
        writing, in a second field, a second reference to a last page, of the longest run, the second field being included in the other of the two memory blocks;
    retrieving, by the processor and in response to receiving a packet, the rule from the page in the ternary content addressable memory; and
    applying, by the processor, the rule to process the packet.

2. The method of claim 1, where selecting the longest run includes:
    examining run records that are associated, respectively, with the plurality of runs of contiguous unwritten pages;
    determining, based on the examining the run records, run lengths associated, respectively, with the plurality of runs of contiguous unwritten pages; and
    identifying the longest run of continuous unwritten pages based on the determined run lengths.

3. The method of claim 1, where creating the two run records includes:
    linking each of the two run records to a linked list of run records.

4. The method of claim 1, further comprising:
    incorporating the two run records into a run table that maintains a plurality of run records,
    where the plurality of run records are associated with a plurality runs of respective lengths, and
    where the run table ranks the plurality of run records based on the lengths of the respective runs.

5. The method of claim 1, where writing the rule on the page includes:
    deleting a run record associated with the longest run, and
    creating two run records associated with, respectively, the two runs of contiguous unwritten pages.

6. The method of claim 1, where the rule includes a classification rule, and where applying the rule to the packet includes: classifying the packet based on the classification rule, and to the packet, and processing the packet based on classifying the packet.

7. The method of claim 1, where the page, in the ternary content addressable memory, is associated with a key, and where retrieving the rule includes:
    matching information included in a header of the packet to the key.

8. The method of claim 1, where applying the rule to the packet includes:
    acquiring, based on the rule, information that is stored in a location that differs from the ternary content addressable memory; and processing the packet based on the information.

9. The method of claim 1, where the rule is associated with a firewall, and where applying the rule includes: determining, based on the rule, whether to route the packet through the firewall.

10. A device comprising:
    a line interface including a ternary content addressable memory that includes runs of contiguous empty pages, where the line interface is to:
        receive a rule from the ternary content addressable memory,
        select a run record that is associated with a run that includes a length that is longest among lengths of a plurality of runs,
        identify a middle page of the run based on the run record,
        write the rule in the middle page to create two new runs,
        construct two run records that correspond to the two new runs,
        allocate, in a memory, two memory blocks for, respectively, the two run records, the memory differing from the ternary content addressable memory,
        write, in a first field, a first reference to a first page, of the longest run, the first field being included in one of the two memory blocks,
        write, in a second field, a second reference to a last page, of the longest run, the second field being included in the other of the two memory blocks,
        receive a packet, and
        apply the rule to process the received packet.

11. The device of claim 10, where the device includes at least one of:
    a router;
    a switch;
    a network interface;
    a proxy server; or
    a firewall.

12. The device of claim 10, where the line interface is further to: retrieve the rule from an access control list.

13. The device of claim 10, where the run record further includes at least one of:
    a field that includes a reference to a first page of the run;
    a third field that includes a reference to a middle page of the run; or
    a field that includes a reference to a last page of the run.

14. The device of claim 10, where the line interface, when applying the rule, is further to: identify an address associated with the packet; and process the packet based on the address.

15. The device of claim 10, where the line interface is further to:
organize the two run records in a run table such that the run table can be efficiently searched for a run record associated with a longest run.

16. A non-transitory memory device comprising:
one or more instructions which, when received by a processor, cause the processor to receive a first rule and a second rule;
one or more instructions which, when received by the processor, cause the processor to select a first run record that is associated with a run that includes a length that is a longest length among lengths of a plurality of runs within a memory;
one or more instructions which, when received by the processor, cause the processor to identify, based on the first run record, a first middle page of the first run;
one or more instructions which, when received by the processor, cause the processor to write the first rule in the second middle page to create two new runs;
one or more instructions which, when received by the processor, cause the processor to construct two run records that correspond to the two new runs;
one or more instructions which, when received by the processor, cause the processor to select a second run record from the constructed two run records, where the second run record is associated with a second run, and where the second run is one of the two runs;
one or more instructions which, when received by the processor, cause the processor to identify, based on the second run record, a second middle page of the second run;
one or more instructions which, when received by the processor, cause the processor to write the second rule in the second middle page;
one or more instructions which, when received by the processor, cause the processor to receive a packet; and
one or more instructions which, when received by the processor, cause the processor to apply the first rule and the second rule to process the received packet.

17. The memory device of claim 16, further comprising:
one or more instructions to retrieve at least one of the first rule or the second rule from an access control list.

18. The memory device of claim 16, where the one or more instructions to select the first run record includes at least one of:
one or more instructions to access a first field that includes a first reference to a first page of the first run;
one or more instructions to access a second field that includes a second reference to a middle page of the first run; or
one or more instructions to access a third field that includes a reference to a last page of the first run.

19. The memory device of claim 16, where the one or more instructions to select the second run record further comprise:
one or more instructions to store the two run records in a run table;
one or more instructions to rank, in the run table, the two run records based on associated lengths; and
one or more instructions select the second run record based on the ranked two run records.

* * * * *